June 6, 1967 M. BELASCO ET AL 3,324,361

SEMICONDUCTOR CONTACT ALLOY

Filed Dec. 11, 1964

MELVIN BELASCO
PRICE T. WENDE
INVENTOR

BY John G. Graham
ATTORNEY

United States Patent Office 3,324,361

Patented June 6, 1967

3,324,361

SEMICONDUCTOR CONTACT ALLOY

Melvin Belasco, Dallas, and Price Tim Wende, Richardson, Tex., assignors to Texas Instruments Incorporated, Dallas, Tex., a corporation of Delaware Filed Dec. 11, 1964, Ser. No. 417,693
4 Claims. (Cl. 317—237)

This invention relates to contacts for semiconductor devices, and more particularly to a metal alloy used for making ohmic contact to P-type III–V compound semiconductor material.

One of the major advantages of wide bandgap semiconductor material such as gallium arsenide is the capability to function as a semiconductor device at elevated temperatures. For example, it is known that gallium arsenide transistors can operate effectively at temperatures as high as 400° C. Even though gallium arsenide permits high temperature operation, this is no advantage if the contact material will not withstand high temperatures. Furthermore, the method of fabricating contacts to the semiconductor material must be compatible with other steps in the fabrication of the device and the contact alloy must uniformly wet the surface of the semiconductor material to form a uniform contact therewith without undue spreading. It is therefore an object of this invention to provide contacts for semiconductor devices which will not impose limitations on the devices for high temperature operation. Another object is to provide contacts for III–V semiconductor devices, particularly gallium arsenide, which permit high temperature operation, but yet may be fabricated by preferred techniques such as evaporation. A particular object is to provide improved base contacts for N-P-N gallium arsenide transistors.

In accordance with this invention, an ohmic contact to P-type gallium arsenide is made from a novel metal alloy, specifically gold, germanium and an acceptor such as zinc. This alloy, preferably about 30% gold, 65% germanium and 5% zinc by weight can withstand operating temperatures virtually as high as the upper limit of a gallium arsenide transistor itself. The alloy contact of this invention can be applied by vacuum evaporation using masking to provide geometrical control. A particular advantage of the contacts of this invention is the manner in which a thin evaporated stripe of the metal alloy will retain its shape during the heating step needed to fuse the contact to the semiconductor and form a low resistance electrical connection.

Figure 1:
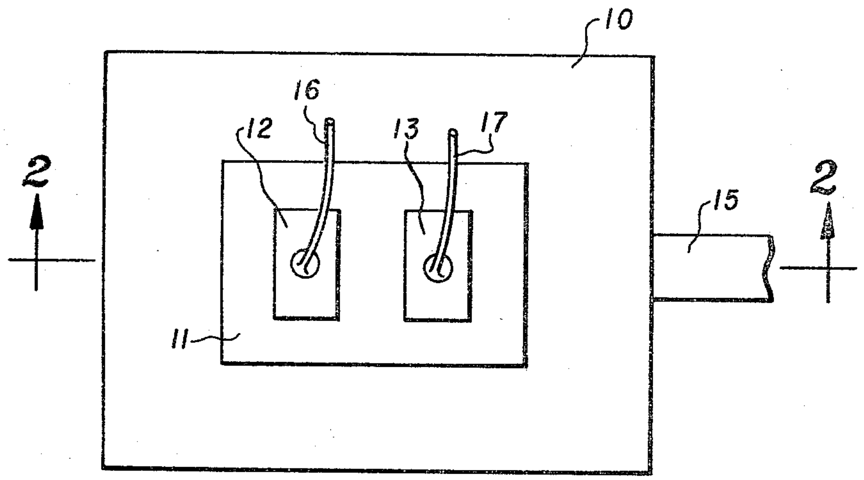
Figure 2:
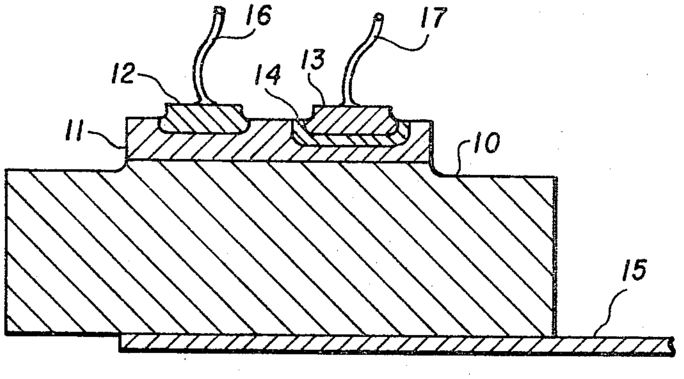

These and other objects and features of the invention will become more readily understood in the following detailed description taken in conjuction with the appended claims and attached drawing, in which:

FIGURE 1 is a plan view of a mesa transistor using the contacts of this invention, and FIGURE 2 is a cross-sectional view of the transistor of FIGURE 1 taken through the line 2—2.

With reference to FIGURE 1, a gallium arsenide transistor of conventional construction is shown which way advantageously employ the improved contacts of this invention. The transistor comprises a wafer 10 of N-type single crystal gallium arsenide having a P-type layer 11 formed on its upper surface, for example by diffusion, and etched to form a mesa of P-type material. An ohmic contact to P-type mesa 11 is provided by an evaporated stripe contact 12 of an alloy of gold, germanium and zinc (AuGeZn) in proportions to be described hereinafter.

A suitable emitter alloy 13 is deposited by evaporation on the top surface of P-type layer 11 in the desired geometrical design. When the wafer 10 is heated, the emitter contact 13 alloys with the P-type layer 11 to form an N-type regrowth region 14. A suitable ohmic contact 15, for example platinum, is attached and electrically connected to the opposite surface of the wafer 10. It will be understood that in the transistor shown and described, wafer 10 constitutes the collector, P-type layer 11 constitutes the base, and regrowth region 14 forms the emitter. Electrical connection to the evaporated base stripe contact 12 and emitter stripe 13 is provided by suitable leads 16 and 17, such as gold wires, bonded to the evaporated stripes.

A transistor as seen in FIGURE 1 is made by techniques well known in the art. A slice of N-type gallium arsenide of perhaps an inch in diameter and twenty mils thickness is subjected to a P-type diffusion operation using magnesium as the impurity to form what will become the base region 11.

It should be appreciated that the wafer 10 is at this point only a small undivided portion of the slice. After the base diffusion, one surface of the slice is masked and etched to create a pattern of hundreds of small mesas such as the mesa 11, each being only perhaps 5 mils x 6 mils. A pattern of base and emitter stripes is then formed on the top face of the slice, with a pair of the stripes being on each mesa. The back side of the slice is then lapped until the slice thickness is reduced to about ten mils. The slice may then be scribed and broken into individual wafers. Electrical contact is conveniently made to each of the evaporated stripe contacts by thermal-compression bonding of a gold wire thereto.

The base contact stripe 12, in accordance with this invention, is composed of an alloy of gold, germanium and zinc, preferably about 30% gold, 65% germanium, and 5% zinc, by weight. This preferred composition can be varied slightly without deleterious effects, but it has been observed that as the percentage of gold is decreased, the alloy becomes difficult to attach leads to, and as the percentage of gold is increased, the alloy tends to run and become disfigured during the high temperature operation of alloying with gallium arsenide.

The preferred composition may be easily evaporated through suitably formed windows in evaporation masks to provide small evaporated stripes on the P-type surface of a gallium arsenide substrate. Thus evaporated base stripes may be formed with the same masks used for evaporation of the emitter stripes and evaporation of both stripe contacts can be performed in a single operation. Furthermore, the AuGeZn alloy described herein may be alloyed to the base layer simultaneously with the emitter alloy at the same temperature used for alloying the emitter alloy which is usually about 950° C. It should be noted that ordinary P-type contact materials would not withstand this high temperature, consequently two separate evaporation and alloying steps were formerly required, the base contact being alloyed at a much lower temperature.

The AuGeZn alloy of the above composition melts at approximately 356° C. (the eutectic of an AuGe alloy). However, the alloy is stable even though liquid at much higher temperatures, thus may be alloyed to gallium arsenide at any temperature between 356° C. and 1240° C. which is the melting point of gallium arsenide. The 5% by weight of zinc is sufficient to cause the alloy to be ohmic to P-type gallium arsenide, while the gold and germanium provide high temperature stability and rigidity to the contact.

Furthermore, the AuGeZn alloy described herein is easily evaporated onto gallium arsenide in any desired geometrical configuration. When heated to a temperature above 356° C., the alloy wets the surface of gallium arsenide and uniformly alloys therewith. Thus an AuGeZn alloy contact evaporated onto gallium arsenide advantageously maintains its original evaporated configuration when alloyed to the gallium arsenide, does not ball up or run, and forms a well defined uniform alloy stripe when fused with P-type gallium arsenide. Furthermore, during the alloying of the AuGeZn base contact stripe 12 to the P-type base region 11, zinc diffuses from the stripe 12 into the base 11. This diffusion increases the acceptor concentration in the base region near the base contact stripe 12, thus advantageously lowering the base resistance ($r_{b'}$) of the transistor.

Although the preferred embodiment utilizes an alloy of gold, germanium and zinc, it is to be understood that other known shallow acceptor impurities such as manganese, copper, magnesium or cadmium, may be substituted for the zinc to provide contact alloys with similar characteristics.

While a mesa transistor is described above as an example of a device wherein the improved contact has particular utility, other semiconductor devices, such as diodes, thermistors, and integrated circuits, as well as other fabrication technologies such as planar fabrication techniques may well utilize the invention.

Other advantages and features of the invention will become readily apparent to those skilled in the art. It is to be understood that the form of this invention herewith shown and described is to be taken as a preferred example of the same and that various changes may be resorted to without departing from the spirit and scope of the invention as defined by the appended claims.

What is claimed is:

1. A gallium arsenide device including a P-type conductivity region and a contact material alloyed with a portion of said P-type conductivity region, said contact material comprising about 30% gold, about 65% germanium, and about 5% acceptor impurity selected from the group consisting of zinc, cadmium, copper, magnesium, and manganese, by weight.

2. In combination with a gallium arsenide device including a P-type conductivity region, an alloy for forming ohmic contact to said P-type conductivity region, said alloy comprising about 30% gold, about 65% germanium, and about 5% acceptor impurity selected from the group consisting of zinc, cadmium, copper, magnesium, and manganese, by weight.

3. A gallium arsenide transistor comprising a body of gallium arsenide having a region of P-type conductivity and a region of N-type conductivity, a rectifying electrode alloyed to said region of P-type conductivity and an ohmic electrode attached to said region of P-type conductivity, said ohmic electrode comprising an alloy of about 30% gold by weight, about 65% germanium by weight, and about 5% acceptor impurity selected from the group consisting of zinc, cadmium, copper, magnesium, and manganese by weight.

4. The gallium arsenide transistor of claim 3 wherein said acceptor impurity is zinc.

References Cited

UNITED STATES PATENTS

| | | | |
|---|---|---|---|
| 2,792,538 | 5/1957 | Pfann | 317—235 |
| 2,798,989 | 7/1957 | Welker | 317—237 |
| 2,979,428 | 4/1961 | Jenny et al. | 317—235 |
| 3,012,175 | 12/1961 | Jones et al. | 317—237 |
| 3,140,536 | 7/1964 | Kuznetzoff | 317—234–5 |
| 3,242,391 | 3/1966 | Gorman | 317—234 |

JAMES D. KALLAM, *Primary Examiner.*